United States Patent [19]
Lee

[11] Patent Number: 5,684,330
[45] Date of Patent: Nov. 4, 1997

[54] CHIP-SIZED PACKAGE HAVING METAL CIRCUIT SUBSTRATE

[75] Inventor: Sang Hyuk Lee, Suwon, Rep. of Korea

[73] Assignee: Samsung Electronics Co., Ltd., Suwon, Rep. of Korea

[21] Appl. No.: 563,402

[22] Filed: Nov. 30, 1995

[30] Foreign Application Priority Data

Aug. 22, 1995 [KR] Rep. of Korea .................. 1995-25959

[51] Int. Cl.⁶ .......................... H01L 23/48; H01L 23/52
[52] U.S. Cl. ..................... 257/692; 257/778; 257/784; 257/787
[58] Field of Search ........................... 257/666, 697, 257/784, 787, 778, 684, 692

[56] References Cited

U.S. PATENT DOCUMENTS

| | | | |
|---|---|---|---|
| 4,819,041 | 4/1989 | Redmond | 257/784 |
| 4,916,519 | 4/1990 | Ward | 257/784 |
| 5,233,220 | 8/1993 | Lamson et al. | 257/784 |
| 5,359,224 | 10/1994 | Heinen et al. | 257/784 |
| 5,363,279 | 11/1994 | Cha | 257/692 |
| 5,442,231 | 8/1995 | Miyamoto et al. | 257/784 |
| 5,519,251 | 5/1996 | Sato et al. | 257/778 |

FOREIGN PATENT DOCUMENTS

| | | | |
|---|---|---|---|
| 576708 | 1/1994 | European Pat. Off. | 257/784 |
| 1-23428 | 5/1989 | Japan | 257/784 |

*Primary Examiner*—Tom Thomas
*Assistant Examiner*—David Ostrowski
*Attorney, Agent, or Firm*—Cushman Darby & Cushman Intellectual Property Group of Pillsbury Madison & Sutro LLP

[57] ABSTRACT

A chip-sized semiconductor package having a semiconductor chip formed with bonding pads; a circuit board provided with contact pads for electrically connecting the circuit board to external terminals, and circuit patterns for electrically connecting the circuit board to the chip; a tape bonding the circuit board to the chip; and wires electrically connecting the circuit board to the bonding pads on the chip; the package being encapsulated by a molding compound so that a part of a surface of the circuit board where the contact pads are formed is exposed.

6 Claims, 2 Drawing Sheets

CHIP-SIZED PACKAGE HAVING METAL CIRCUIT SUBSTRATE

BACKGROUND OF THE INVENTION

1. Field of the Invention

The present invention relates generally to a chip-sized semiconductor package, and in particular to a chip-sized semiconductor package which employs a metal circuit board and can be applied to a currently used plastic assembly process.

2. Description of the Prior Art

One of the critical factors for an MCM (Multi Chip Module) in which a plurality of bare chips is mounted on a single substrate, is control of the quality of the chips which are to be mounted. That is to say, the characteristics of a chip should be known prior to mounting it on the substrate. In other words, the chips should be KGDs (Known Good Dies). Since KGDs are tested in the state of bare chips, their control, storage and testing are expensive, and they require careful handling.

As a solution to problems associated with KGDs, a CSP (Chip Scale Package or Chip-Sized Package) has been proposed. A CSP is one kind of Ball Grid Array package, and is advantageous over conventional a KGD in that its size is as small as that of one bare chip. Further, a CSP can be supplied to the consumer as a known good die, and it can be mounted by using conventional surface mounting technology (SMT). Therefore, CSP usage can contribute to miniaturization, high performance, and multi-functionality of electronic appliances.

FIG. 1 of the attached drawings is a cross-sectional view of a conventional chip-sized package as disclosed in Tessera [P. A. Gargini and G. H. Parker: "Microprocessor Technology Towards The Year 2000", Semicon/Kansai-Kyoto Technology Seminar 92 Processing, Jun. 11–12, pp 16–22].

The conventional chip-sized package shown in FIG. 1, designated as "Tessera Compliant Chip (TCC™) by the developer company, is a μBGA (micro-Ball Grid Array) package designed for high density and high performance applications. It has a structure in which a pattern is formed to interconnect the chip (1) to the array bumps (3) through the flex circuit substrate (5). The flex circuit substrate (5) is bonded to the chip (1) by way of a compliant elastomer layer (7). The elastomer layer (7) is made of silicone, and is connected to the bonding pads (2) formed on the chip (1) through bonding leads (8). The TCC™ chip may be encapsulated with silicone (9) to protect it from environmental factors such as dust, mechanical shock, and static electricity.

For the TCC™ chip, the flex circuit substrate (5) is made of copper and polyimide, and the nickel bumps (3), coated with gold, each have a height of 0.1 mm. For the TCC™ package, since the average electric interconnections are as short as 1.0–1.5 mm, the inductance, capacitance and signal delay are very low, and a high density mounting is possible.

However, the TCC™ package has disadvantages that expensive array bumps (3) and flex circuit substrate (5) are required, and that chip alignment for connection between the bonding pads (2) and the bonding leads (8) needs careful operation such as can be provided in TAB bonding. The later aspect is disadvantageous over use of wire-bonding connection technologies, in light of mass production.

SUMMARY OF THE INVENTION

Accordingly, an object of the present invention is to provide a chip-sized semiconductor package, which can be produced at a low cost, with good productivity.

This object can be accomplished by providing a chip-sized semiconductor package comprising a semiconductor chip formed with bonding pads;

a circuit board provided with contact pads for electrically connecting it to external terminals and circuit patterns for electrically connecting it to the chip;

a tape for bonding the circuit board to the chip; and wires for electrically connecting the circuit board to the bonding pads on the chip;

this package being encapsulated with a molding compound so that part of a surface of the circuit board where the contact pads are formed is exposed.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

The present invention will now be described in more detail with reference to FIGS. 2–5 of the accompanying drawings.

Figure 1:
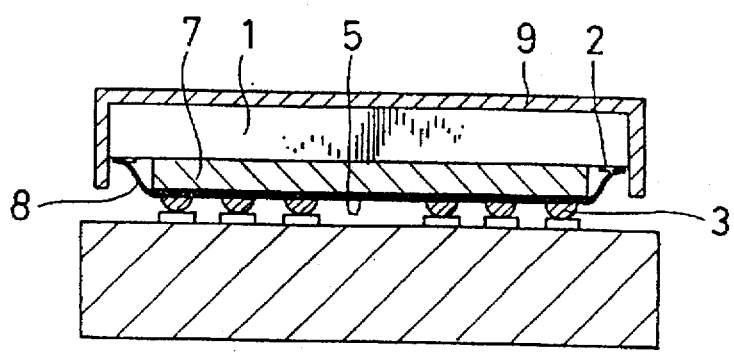
FIG. 1 is a cross-sectional view of a conventional chip-sized package.
Figure 2:
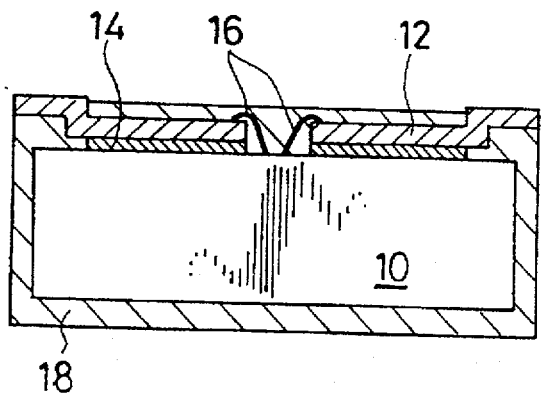
FIG. 2 is a cross-sectional view of one embodiment of a chip-sized package according to the present invention.

FIG. 2 is a cross-sectional view of one embodiment of a chip-sized package according to the present invention. With reference with FIG. 2, a semiconductor chip (10) is attached to metal circuit board (12) by way of a piece of polyimide tape (14). Then, electrical connection between the chip (10) and the board (12) is performed using gold or aluminum wires (16). Next, the entire chip assembly is encapsulated with a molding compound (18) so that part of a surface of the board (12) where contact pads are formed is or can be exposed for electrically connecting the package to external terminals.

For the present invention, the electrical connection between the chip (10) and the metal circuit board (12) is performed by using gold or aluminum wires, (16) as in wire bonding of conventional plastic packages. As the molding compound (18), thermoplastic resins such as epoxy molding compound, which is used for conventional plastic packaging, or those employed for COB (chip on board) may be used for the molding compound in the present invention.

The metal circuit board (12) is made of a thin metal layer (12a) with high thermal conductivity, for the purpose of efficient heat dissipation. For example, it may be a thin copper plate coated with an insulating material (12b).

Figure 3:
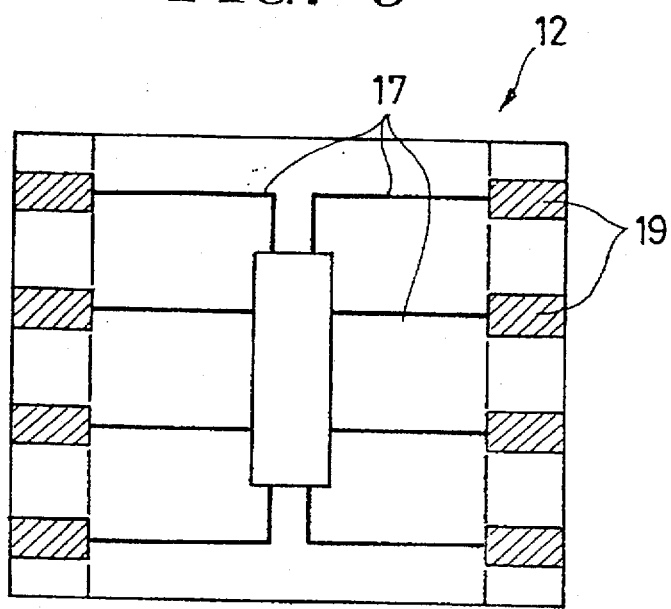
FIG. 3 is a plan view of a metal circuit board employed for the chip-sized package according to the present invention.
Figure 4:
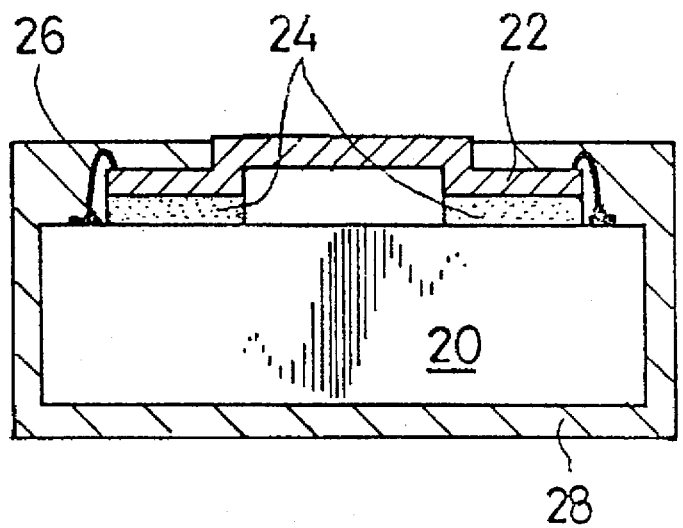
FIG. 4 is a cross-sectional view of another embodiment of a chip-sized package according to the present invention.

The metal circuit board (12) package according to the present invention may have a contour as shown in FIG. 2, or a contour as shown in FIG. 4. Thus, the board (12) is stepped upward (FIG. 2) or downward (FIG. 4) in two laterally opposite areas at its outer perimetrical margin. The uplifted areas (FIGS. 2 and 3) have contact pads (19) on their upper surfaces for electrical connection of the resulting package to external terminals, and are exposed from the resulting package. The remaining, more medial, sunk area has circuit patterns (17) for electrically connecting the board (12) to the chip (10) via wires (16) on its surface.

The circuit board (12) will be described in more detail hereinafter.

With reference to FIG. 3, the metal circuit board (12) is a thin copper plate (12a) provided with circuit patterns for electrically connecting the metal circuit board (10) to the chip (10), and contact pads (19) for electrically connecting the resulting package to external terminals (not shown). The thin copper plate (12a) is coated with an insulating material (12b) (not numbered).

In one embodiment of circuit board (12) according to the present invention, as shown in FIG. 3, the circuit board (12) is stepped upward at locations bordering its outer perimeter, and has a hole (not numbered) at its sunk center area. Each uplifted outer perimetrical area has contact pads (19) for electrical connection of the package to external terminals on its upper surface, and the sunk center area has a hole at its center and circuit pattern (17) for electrically connecting the board (12) to a chip (10) having corresponding bonding pads on its surface. The board (12) is aligned to a chip (10) to corresponding bonding pads on the chip (10), and interconnection therebetween is performed via wires (16) (FIG. 2).

The circuit board (12) is bonded to the chip (10) using adhesive tape (14).

Then, the entire package is encapsulated with a molding compound (18) so that the uplifted outer perimetrical areas formed with contact pads (19) are or can be exposed.

The contact pads (19) are used for connecting the CSP to external terminals, by soldering. The CSP of the present invention may be mounted on external circuit boards by conventional methods for mounting plastic packages on external circuit boards. That is to say, solder pastes are placed on the mounting positions on the external circuit board, and then the CSP is placed thereon, followed by reflow soldering.

FIG. 4 shows another package which employs another circuit board of the invention formed with circuit patterns in two laterally opposite outer perimetrically areas thereof, and a chip having corresponding bonding pads.

With reference to FIG. 4, a semiconductor chip (20) is attached by a bonding tape layer (24) on a metal circuit board (22) by way of polyimide tape (24). Interconnection between the chip (20) and the circuit board (22) is made using wires (26) which connect bonding pads (34) on the chip (20) to the circuit patterns (not shown) formed on the respective outer perimetrical areas of the circuit board (22). For this package, the circuit board (22) has a size smaller (in the directions top to bottom and left to right in FIG. 5) than the chip (20). The resulting entire chip assembly is encapsulated by a molding compound (28) to protect it from environmental factors. As described above in relation with the package shown in FIG. 2, the electrical connections between the chip (20) and the metal circuit board (22) may be accomplished by using gold or aluminum wires, as in wire bonding of the conventional plastic packages. As the molding compound (18), thermoplastic resins such as epoxy molding compound, which is used for conventional plastic packaging, or those employed for COB (chip on board) may be used for the present invention.

As encapsulation technology, a partial encapsulation is employed in order that the uplifted part of the surface of the board, where contact pads for connection to external terminals, is left exposed, as described above.

Figure 5:
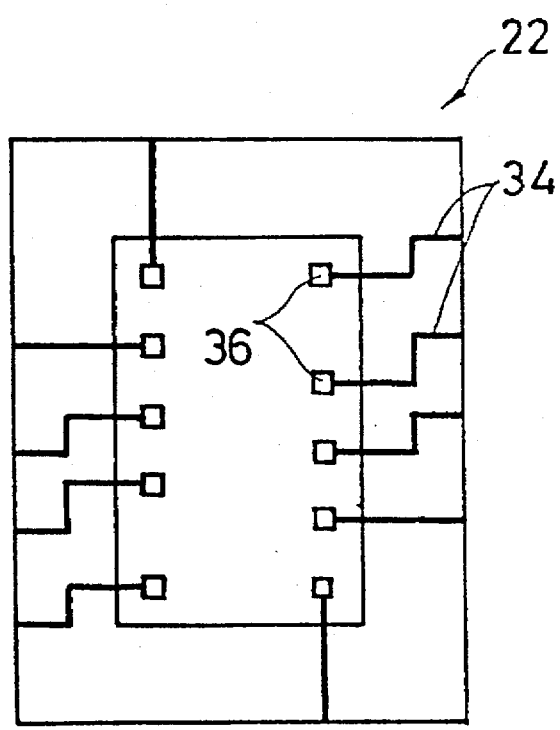
FIG. 5 is a plan view of a metal circuit board employed for the chip-sized package according to the present invention shown in FIG. 4.

FIG. 5 is a plan view of a metal circuit board (22) for the chip-sized package of the present invention as shown in FIG. 4. The metal circuit board (22) has a structure that circuit patterns (34) are formed on the sunk outer peripheral areas of the board, and contact pads (36) are formed on the upper surface of the more central, i.e., the more medial area.

As described above, the chip-sized package according to the present invention is advantageous over the conventional one which requires costly additional flexible circuitry, array bumps and use of the TAB bonding process, in that the chip-sized package according to the present invention does not require such costly parts nor use of such a precise process, and can be applied to a conventional assembly process, thereby its production can be simplified. In particular, the metal circuit board placed on the chip can efficiently dissipate heat generated during operation of device.

Although preferred embodiments of the present invention have been described in detail hereinabove, it should be clearly understood that many variations and/or modifications of the basic inventive concepts herein taught which my appear to those skilled in the art will still fall within the spirit and scope of the present invention as defined in the appended claims.

What is claimed is:

1. A chip-sized semiconductor package, comprising:

a semiconductor chip having a plurality of bonding pads centrally formed thereon;

a circuit board having at least one metal layer, at least one electrically non-conductive layer formed on said metal layer, and a plurality of circuit patterns formed on said electrically non-conductive layer, each circuit pattern having a contact pad, said circuit board having an outer perimeter;

a tape bonding said circuit board to said semiconductor chip;

a plurality of wires electrically connecting respective ones of said circuit patterns of said circuit board to respective ones of said bonding pads of said semiconductor chip; and a molding compound encapsulating said semiconductor chip and said plurality of wires;

said circuit board being stepped adjacent said outer perimeter thereof so as to have an uplifted outer perimetrical bordering surface and a sunk central surface; said uplifted outer perimetrical bordering surface having said plurality of contact pads, for being electrically connected to external terminals; said sunk central surface having said plurality of circuit patterns, for being electrically connected to said bonding pads of said semiconductor chip; and said molding compound partially encapsulating said circuit board, so that said contact pads remain exposed.

2. The chip-sized semiconductor package of claim 1, further comprising:

a hole centrally formed through said circuit board, through said sunk central surface; said wires electrically connecting said circuit patterns to said bonding pads extending through said hole.

3. The chip-sized semiconductor package of claim 1, wherein:

said contact pads are arranged to be soldered for connecting said package to external terminals.

4. The chip-sized semiconductor package, comprising:

a semiconductor chip having a plurality of bonding pads peripherally formed thereon;

a circuit board having at least one metal layer, at least one electrically non-conductive layer formed on said metal layer, and a plurality of circuit patterns formed on said electrically non-conductive layer, each circuit pattern having a contact pad, said circuit board having an outer perimeter;

a tape bonding said circuit board to said semiconductor chip;

a plurality of wires electrically connecting said circuit patterns of said circuit board to said bonding pads of said semiconductor chip; and a molding compound encapsulating said semiconductor chip and said plurality of wires;

said circuit board being stepped adjacent said outer perimeter thereof so as to have an uplifted central surface and a sunk outer perimetrical bordering surface; said uplifted central surface having said plurality of contact pads, for being electrically connected to external terminals; said sunk outer perimetrical bordering surface having said plurality of circuit patterns, for being electrically connected to said bonding pads of said semiconductor chip; and said molding compound partially encapsulating said circuit board so that said contact pads remain exposed.

5. The chip-sized semiconductor package of claim 4, wherein:

said contact pads are arranged to be soldered for connecting said package to external terminals.

6. The chip-sized semiconductor package of claim 4, wherein:

said circuit board has a perimetrical confronting said semiconductor chip size which is smaller than that of said semiconductor chip.

\* \* \* \* \*